US008183879B2

(12) United States Patent
Brederlow et al.

(10) Patent No.: US 8,183,879 B2
(45) Date of Patent: May 22, 2012

(54) MEASURING ARRANGEMENT, SEMICONDUCTOR ARRANGEMENT AND METHOD FOR OPERATING A SEMICONDUCTOR COMPONENT AS A REFERENCE SOURCE

(75) Inventors: Ralf Brederlow, Poing (DE); Roland Thewes, Gröbenzell (DE)

(73) Assignee: Infineon Technologies AG, Neubiberg (DE)

( * ) Notice: Subject to any disclaimer, the term of this patent is extended or adjusted under 35 U.S.C. 154(b) by 607 days.

(21) Appl. No.: 12/399,581

(22) Filed: Mar. 6, 2009

(65) Prior Publication Data

US 2009/0322371 A1    Dec. 31, 2009

(51) Int. Cl.
*G01R 31/02* (2006.01)
*G01R 31/26* (2006.01)

(52) U.S. Cl. ......... 324/762.09; 324/762.1; 324/718; 324/719; 438/14; 438/15; 438/16; 438/17; 438/142; 438/478; 438/479; 438/480; 438/485; 438/490; 438/495; 438/496; 438/497; 438/498; 438/499; 438/500; 438/501; 438/502; 438/503; 438/504; 438/505; 438/506; 438/507; 438/508; 438/509

(58) Field of Classification Search ............ 324/762.09, 324/762.1, 718, 719; 438/14–17, 142, 478–509
See application file for complete search history.

(56) References Cited

U.S. PATENT DOCUMENTS

| | | | | |
|---|---|---|---|---|
| 4,380,864 A * | 4/1983 | Das | | 438/17 |
| 4,540,452 A * | 9/1985 | Croset et al. | | 438/479 |
| 4,626,101 A * | 12/1986 | Ogawa et al. | | 356/237.2 |
| 5,342,797 A * | 8/1994 | Sapp et al. | | 438/268 |
| 5,618,760 A * | 4/1997 | Soh et al. | | 438/703 |
| 5,804,975 A * | 9/1998 | Alers et al. | | 324/613 |
| 6,049,213 A * | 4/2000 | Abadeer | | 324/719 |
| 6,127,881 A * | 10/2000 | Tsay et al. | | 327/538 |
| 6,275,059 B1 * | 8/2001 | Sah et al. | | 324/762.05 |
| 6,456,105 B1 * | 9/2002 | Tao | | 324/762.09 |
| 6,462,565 B1 * | 10/2002 | Kim et al. | | 324/716 |
| 6,469,535 B1 * | 10/2002 | Egashira et al. | | 324/762.01 |
| 6,472,233 B1 * | 10/2002 | Ahmed et al. | | 438/14 |
| 6,566,710 B1 * | 5/2003 | Strachan et al. | | 257/341 |
| 6,828,752 B2 * | 12/2004 | Nakatsugawa et al. | | 318/801 |
| 6,890,772 B2 * | 5/2005 | Liu et al. | | 438/14 |
| 6,956,387 B2 * | 10/2005 | Ho et al. | | 324/756.05 |
| 6,967,499 B1 * | 11/2005 | Haase et al. | | 324/762.03 |
| 7,205,777 B2 * | 4/2007 | Schulz et al. | | 324/661 |
| 7,535,021 B2 * | 5/2009 | Bhalla et al. | | 257/48 |
| 7,834,422 B2 * | 11/2010 | Andresen et al. | | 257/607 |
| 7,859,289 B2 * | 12/2010 | Chatterjee et al. | | 324/762.09 |
| 7,986,146 B2 * | 7/2011 | Levinson et al. | | 324/525 |
| 2001/0050577 A1 * | 12/2001 | Maeda | | 324/769 |

(Continued)

OTHER PUBLICATIONS

El-Sayed et al., "Study of Interface Trap Properties in MOSFETs Using Split-Current Measurements," Solid State Electronics, 1991, pp. 173-180, vol. 34, No. 2, Pergamon Press plc, Great Britain.

*Primary Examiner* — Roberto Velez
*Assistant Examiner* — Lamarr Brown
(74) *Attorney, Agent, or Firm* — Murphy, Bilak & Homiller, PLLC

(57) ABSTRACT

The invention relates to a measuring arrangement, a semiconductor arrangement and a method for operating a reference source, wherein at least one semiconductor component and a voltage source are connected to a measuring unit and the measuring unit provides a measured value that is proportional to the number of defects.

19 Claims, 4 Drawing Sheets

U.S. PATENT DOCUMENTS

| | | | |
|---|---|---|---|
| 2002/0102752 A1* | 8/2002 | Huang et al. | 438/17 |
| 2003/0012925 A1* | 1/2003 | Gorrell | 428/137 |
| 2004/0021470 A1* | 2/2004 | Adams et al. | 324/522 |
| 2004/0147127 A1* | 7/2004 | Noguchi et al. | 438/690 |
| 2005/0158929 A1* | 7/2005 | Yamazaki et al. | 438/166 |
| 2006/0103450 A1 | 5/2006 | Chen et al. | |
| 2006/0238217 A1* | 10/2006 | Williams et al. | 326/9 |
| 2007/0285543 A1* | 12/2007 | Uchida | 348/294 |
| 2008/0038851 A1* | 2/2008 | Koyama et al. | 438/17 |
| 2008/0211500 A1* | 9/2008 | Tahir-Kheli et al. | 324/316 |
| 2008/0224725 A1* | 9/2008 | Sugawa et al. | 324/769 |
| 2008/0309365 A1* | 12/2008 | Liao et al. | 324/769 |
| 2009/0027074 A1* | 1/2009 | Ko et al. | 324/763 |

* cited by examiner

US 8,183,879 B2

MEASURING ARRANGEMENT, SEMICONDUCTOR ARRANGEMENT AND METHOD FOR OPERATING A SEMICONDUCTOR COMPONENT AS A REFERENCE SOURCE

CROSS-REFERENCE TO RELATED APPLICATION

This application claims priority to German application number DE 10 2008 015 211.0 filed Mar. 20, 2008.

FIELD OF THE INVENTION

The invention relates to a measuring arrangement, a semiconductor arrangement and a method for operating a semiconductor component as a reference source, wherein a reference value that is proportional to the number of defects in a semiconductor component is provided at an output of the arrangements.

BACKGROUND

Integrated circuits for the most part require reference sources that are to the greatest possible extent independent of process fluctuations, fluctuations in the supply voltage and/or fluctuations of ambient variables. Ambient variables that shall be mentioned here include the temperature, in particular, though vibrations and pressure, for example, should also be regarded as ambient variables.

A large number of circuits and circuit concepts have been disclosed hitherto for generating a reference value, for example, a reference voltage or a reference current. One known method for generating a reference value is the principle of compensating for fluctuations which are accumulated in the form of additive disturbances on the reference value. Primarily bipolar transistors or diodes are provided for this purpose. One method employed in generating a reference value is the principle of temperature compensation. For this purpose, firstly an output variable proportional to temperature is provided in a first circuit unit. Generally such circuits are referred to as "proportional to absolute temperature" (PTAT) circuits. This proportional temperature dependence of the output variable is then compensated for in a further switching unit.

All the methods disclosed hitherto require a sufficiently high supply voltage for suppressing process fluctuations and fluctuations of the supply voltage.

SUMMARY

A measuring arrangement and a semiconductor arrangement are presented, comprising at least one semiconductor component, wherein the semiconductor component has a semiconductor substrate, has, in the semiconductor substrate, at least one doped region adjoining a top side of the semiconductor substrate in planar fashion, has, on the top side of the semiconductor substrate, an insulation layer adjoining the doped region, has a gate connection layer on the insulation layer, has at least one defect in the interface between insulation layer and semiconductor substrate, a voltage source, wherein the voltage source is connected to the gate connection layer by a first connection, and is connected to a reference potential by a second connection, and a measuring unit, wherein the measuring unit has at least a first and a second input and also an output, the first input is connected to the semiconductor substrate, the second input is connected to the doped region, and the output provides a measured value that is proportional to the number of defects.

Furthermore, a method for operating a semiconductor component as a reference source is provided, comprising the following method steps:

applying a trapezoidal voltage to the gate connection layer, wherein the voltage has a first and a second voltage value and the first voltage value operates the semiconductor component in accumulation and the second voltage value operates the semiconductor component in inversion, connecting a measuring unit, wherein the measuring unit has a first and a second measuring input, the first measuring input is connected to the at least one doped region of the semiconductor component and the second measuring input is connected to the substrate of the semiconductor component, detecting a measured value at the output of the measuring unit, wherein the measured value is proportional to the number of defects in the semiconductor component, operating the semiconductor component as a reference source, wherein the measured value is converted into a reference value.

Further configurations are specified in the subordinate patent claims.

BRIEF DESCRIPTION OF THE DRAWINGS

Exemplary embodiments of the invention are explained below with reference to the drawings, wherein the figures of identical or identically acting constituent parts are in each case identified by the same reference symbols. The elements illustrated should not be regarded as true to scale; rather, individual elements may be illustrated with an exaggerated size or with exaggerated simplification, in order to afford a better understanding. In the figures.

DETAILED DESCRIPTION

Figure 1:
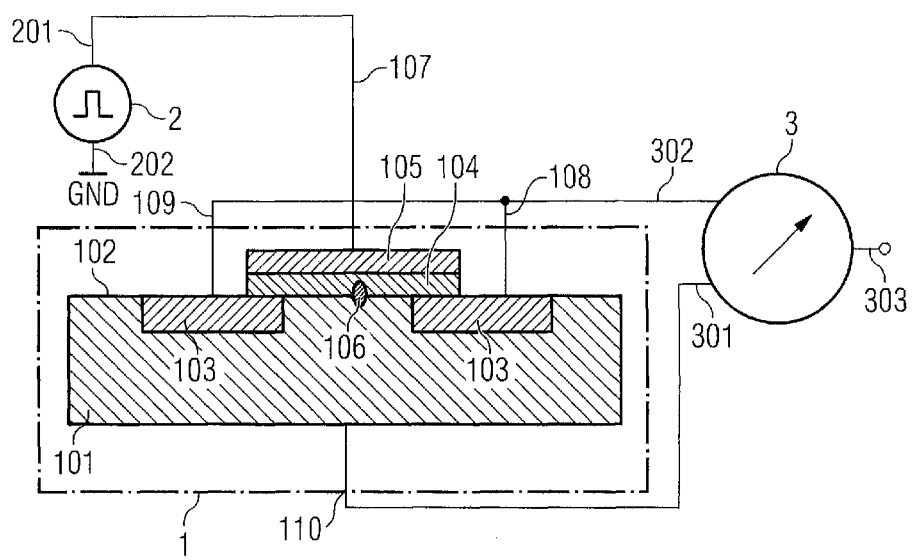
FIG. 1 shows an exemplary embodiment of a measuring arrangement for providing a measured value that is proportional to a number of defects.

FIG. 1 presents an exemplary embodiment of a measuring arrangement for providing a measured value that is proportional to the number N of defects 106. A semiconductor component 1 comprising a gate connection 107, a drain connection 108, a source connection 109, and a substrate connection 110 is presented here. The semiconductor component has a semiconductor substrate 101. Two doped regions 103 are arranged within the semiconductor substrate 101. The two regions 103 adjoin a top side 102 of the semiconductor substrate 101 in planar fashion. An insulation layer 104 is arranged on the top side 102 of the semiconductor substrate 101, wherein the insulation layer 104 covers at least the interspace between the doped regions 103. A gate connection layer 105 is arranged on the insulation layer 104. The interface between the insulation layer 104 and the semiconductor substrate 101 has at least one defect.

The semiconductor component 1 described is a transistor according to FIG. 1. The measuring arrangement can also be operated if only one doped region 103 is formed in the substrate, or only the drain connection 108 or only the source connection 109 of the transistor is connected to the measuring unit 3.

The following description is primarily applicable to the use of NMOS field-effect transistors. An inverse consideration should be adopted with the use of a PMOS transistor.

A weakly p-doped silicon single crystal, in particular, serves as the semiconductor substrate 101. Doping is understood here to mean the introduction of impurity atoms into the silicon crystal lattice structure, wherein the introduction of acceptors corresponds to a p-type doping and the introduction of donors corresponds to an n-type doping. Two heavily n-doped regions 103 that respectively produce the source and drain connections 109, 108 are introduced into the semiconductor substrate 101. The semiconductor substrate 101 is still situated between the two regions 108, 109, whereby a structure arises which initially does not permit a current flow. A very thin insulation layer 104, for example, silicon dioxide layer, is then applied precisely over this remaining interspace. The gate connection 107 of the transistor is formed by a conductive gate connection layer 105 applied on this dielectric, that is to say the insulation layer 104. During operation of the transistor, the so-called n-channel is formed between the two doped regions 108, 109 in the semiconductor substrate 101. The interspace between the two regions 108, 109 is covered by the insulation layer 104 on the top side 102. Aluminum, or $n^+$- or $p^+$-doped, so-called degenerate polycrystalline silicon is used for the gate connection layer 105.

Since the lattice constants of the semiconductor substrate 101 and of the insulation layer 104 do not match, defects 106 arise upon application of the insulation layer, which is a silicon dioxide layer, in particular. Said defects 106 are also referred to as dangling bonds, that is to say as open lattice bonds.

A voltage source 2 is in turn electrically conductively connected to the gate connection 107 by a first connection 201. A second connection of the voltage source 2 is connected to the reference potential GND. Furthermore, the drain connection 108 and the source connection 109 are electrically conductively connected to a first input 302 of a measuring unit 3. A second input 301 of the measuring unit 3 is in turn connected to the substrate connection 110 of the semiconductor component 1. The measuring unit 3 furthermore has an output 303.

By virtue of the construction of the semiconductor component 1, gate connection 107, insulation layer 104 and substrate connection 110 form a capacitor that is charged when a voltage is applied between gate connection 105 and bulk connection 110. As a result of the electric field, minority carriers, which are electrons in the case of a p-type silicon as semiconductor substrate 101, migrate in the semiconductor substrate 101 to the boundary layer and recombine with the majority carriers, also referred to as defect electrons. This state is called depletion. Starting from a specific voltage magnitude $U_{th}$, also referred to as threshold voltage, the displacement of the majority charge carriers is so great that they are no longer available for recombination. Accumulation of minority carriers occurs, whereby the actually p-doped substrate 101 becomes n-conducting near to the insulating layer 104.

This state is called strong "inversion". By contrast, if a negative voltage is applied to the gate connection 105, this is referred to as accumulation or enhancement of the semiconductor component 1.

The voltage source 2 generates a trapezoidal voltage, in particular, wherein the voltage has at least a first and a second voltage value 203, 204. This voltage is ideally rectangular. This voltage at the gate connection 105 of the semiconductor component 1 oscillates between two voltage values, of which the first voltage value 203 is less than the minimum gate voltage that puts the semiconductor component 1 into accumulation, and the second voltage value 204 is greater than the voltage for attaining the inversion conditions in the channel of the semiconductor component 1. Both conditions apply to an n-MOS semiconductor component, in particular an n-MOS transistor. The two voltage values 203, 204 are correspondingly inverse if a p-MOS semiconductor component, in particular a p-MOS transistor, is used.

Under these conditions of the voltage, the interface states are charged in the channel region and are discharged again via the semiconductor substrate 101. If the second voltage value 204 is present at the gate connection 107, then the semiconductor component 1 is operated in inversion. Freely mobile charge carriers are thereby bound in the defects 106. The defects 106 retain these charge carriers. If the first voltage value 204 is applied to the gate connection 107, then the semiconductor component 1 is operated in accumulation. The charge carriers previously bound in the defects 106 are thereby liberated again. These liberated charge carriers recombine in the semiconductor substrate 101.

By means of a measuring unit 3, which is electrically conductively connected to the substrate connection 110 by a first input 301 and is connected to the doped regions 103 by a second input 302, the recombination of the liberated charge carriers can be detected as a measured value. This measured value is provided at the output 303 of the measuring unit 3.

The measured value thus determined, a current value Imeas in this case, is proportional to the number N of defects 106, the frequency f of the voltage source 2 and the elementary charge e. The elementary charge is a natural constant and corresponds to a value of $e=1.602176487\times10^{(-19)}$ coulomb. In particular the following relationship holds true:

$$Imeas = f \times e \times N.$$

In this case, the semiconductor component 1, in a specific form a transistor, preferably has the technologically available minimum gate length and/or gate width. The number N of defects 106 per semiconductor component is thereby reduced to a very low value. If the number of defects in the semiconductor component 1 is very small, discrete or quantized states can be expected for the measured value obtained.

Figure 2:
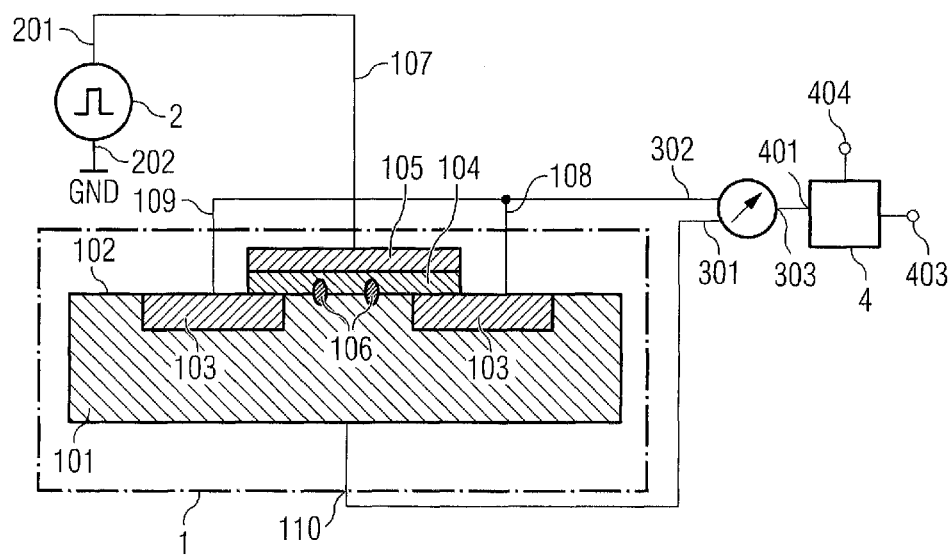
FIG. 2 shows a development of the exemplary embodiment illustrated in FIG. 1.

FIG. 2 presents a development of the exemplary embodiment illustrated in FIG. 1. Only the difference between FIG. 1 and FIG. 2 is discussed below. An evaluation unit 4 is additionally presented in FIG. 2. The evaluation unit 4 is connected by its first input 401 to the output 303 of the measuring unit 3. The evaluation unit 4 furthermore has an output 403.

With the above current formula and the assumption that only one defect 106 is present in the semiconductor component, initially a unit current I0 can be calculated, which is dependent only on the frequency f and a natural constant e. If the number N of defects 106 is greater than one, a measured value proportional to said unit current I0 is detected in the measuring arrangement. The evaluation unit 4 is constituted in such a way that the number N of defects 106 in this semiconductor component 1 is deduced on the basis of the measured value detected and the relationship between measured value and number N of defects 106. A datum comprising the number N of defects 106 of the measured semiconductor component 1 is thus provided at the output 403 of the evaluation unit 4.

With the measuring arrangement illustrated in FIG. 2 it is possible, then, to determine the number N of defects 106 of any desired semiconductor component 1. This is referred to hereinafter as inherent characterization. Semiconductor components having a minimum gate length and/or gate width are preferably used since the number N of defects 106 situated therein is small. By means of the evaluation unit and the known number N of defects 106 in the semiconductor component 1 examined, it is then possible to make the statement that this semiconductor component 1 examined supplies N times the unit current I0.

By interconnection of a plurality of semiconductor components 1 whose number N of defects 106 is known, it is possible to generate a reference value corresponding to a desired multiple N of the unit current I0. The datum generated by the evaluation unit 4 contains the number N of defects 106 with respect to the corresponding semiconductor component 1. Consequently, each number N of defects 106 is assigned to a concrete semiconductor component 1. The aim is to use semiconductor components 1 having few defects, in order to obtain a reference source that is as accurate as possible. The inherent characterization of a plurality of semiconductor components 1 is presented in the description concerning FIG. 6.

Preferably, the semiconductor components 1 for this measuring arrangement should be used in a dedicated well in the semiconductor substrate 101, such that semiconductor components 1 of different types can be used which do not influence one another. In this case, a well is understood to be a specially shielded region of the semiconductor substrate 101.

Since the number N of defects 106 in such a semiconductor component 1 satisfies statistical laws, a plurality of redundant semiconductor components 1 are provided within an arrangement on the chip in order to ensure high yields in production. Furthermore, the number of semiconductor components 1 to be used is dependent on the defect density of the technology used and on the area of the semiconductor components 1 used. The resulting number of required semiconductor components 1 which is to be implemented in the circuit in order to generate a specific reference value then results from the magnitude of the desired reference value and the number N of defects 106 per semiconductor component 1.

The trapezoidal voltage preferably has a frequency f of 1 to 10 MHz. By means of the equation above, the number N of defects 106 can be calculated in the evaluation unit 4 on the basis of the known frequency f, the elementary charge e and the measured value determined, here, in particular a current value Imeas.

Figure 3:
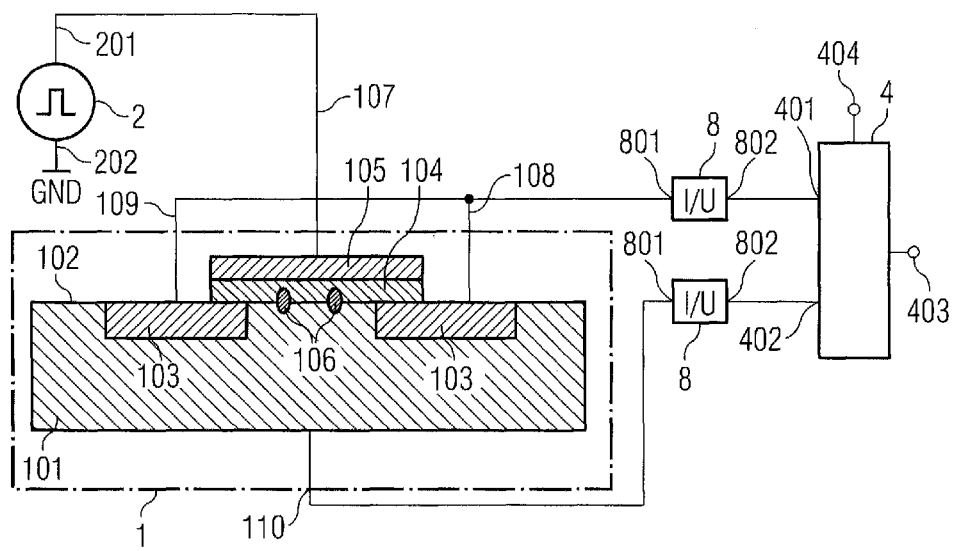
FIG. 3 shows an alternative exemplary embodiment of a measuring arrangement.

FIG. 3 presents an alternative exemplary embodiment of a measuring arrangement. The difference between FIG. 2 and FIG. 3 is described below. The evaluation unit 4 has two inputs in FIG. 3. A first and a second current-voltage converter 8 are provided instead of the measuring unit 3. In this case, each current-voltage converter 8 has an input 801 and an output 802. The first current-voltage converter 8 is connected to the source connection 109 by its input 801. The output 802 of the current-voltage converter 8 is connected to a first input of the evaluation unit 4. The second current-voltage converter 8 is connected to the semiconductor substrate 101 by its input 801. The second current-voltage converter 8 is connected to a second input of the evaluation unit 4 by its output 802.

A measured value Umeas is provided between the two outputs of the current-voltage converters 8, said measured value corresponding to:

$$U\text{meas} = 2 * e \times f \times N / G.$$

In this case, G is the transconductance of the current-voltage converter 8 used.

Figure 4:
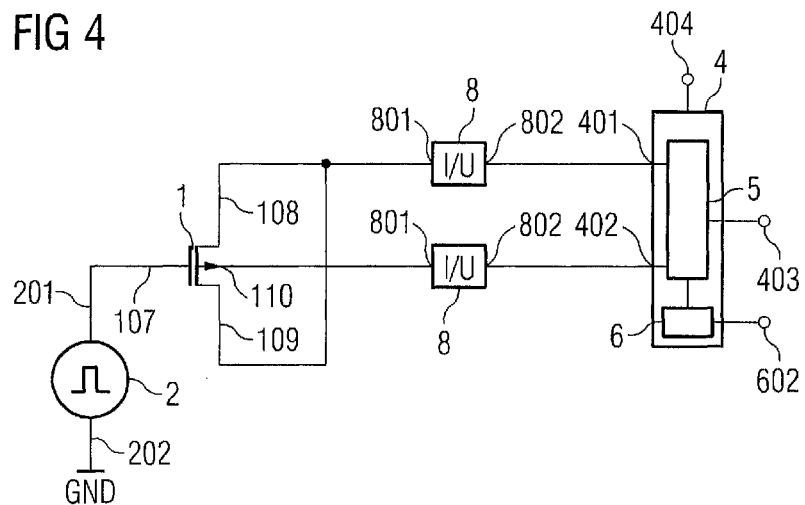
FIG. 4 shows a development of the exemplary embodiment illustrated in FIG. 3.

FIG. 4 illustrates a development of the alternative exemplary embodiment presented in FIG. 3. The semiconductor component 1 is illustrated in FIG. 4 as a circuit symbol with the gate connection 107, the drain connection 108, the source connection 109 and the substrate connection 110. The interconnection corresponds to the interconnection from FIG. 3. The evaluation unit 4 is illustrated in greater detail in FIG. 4 and contains a calculation unit 5 having a first and a second input and an output, wherein the output of the calculation unit 5 is connected to a data memory 6. The calculation unit 5 determines the number N of defects 106, which is calculated according to the above formulae. Since e, f and Umeas are known, the number N of defects 106 in the semiconductor component 1 is calculable. The calculation unit 5 provides the number N of defects 106 determined to a data memory 6. In addition to the number N of defects 106, the position or information about the measured semiconductor component 1 is also stored in the data memory 6. The data memory 6 furthermore has a data output 602, at which the stored data are made accessible to a unit (not illustrated) connected downstream. The unit connected downstream can be realized as software or hardware. The data output can be connected to other units in the form of a bus.

Figure 5:
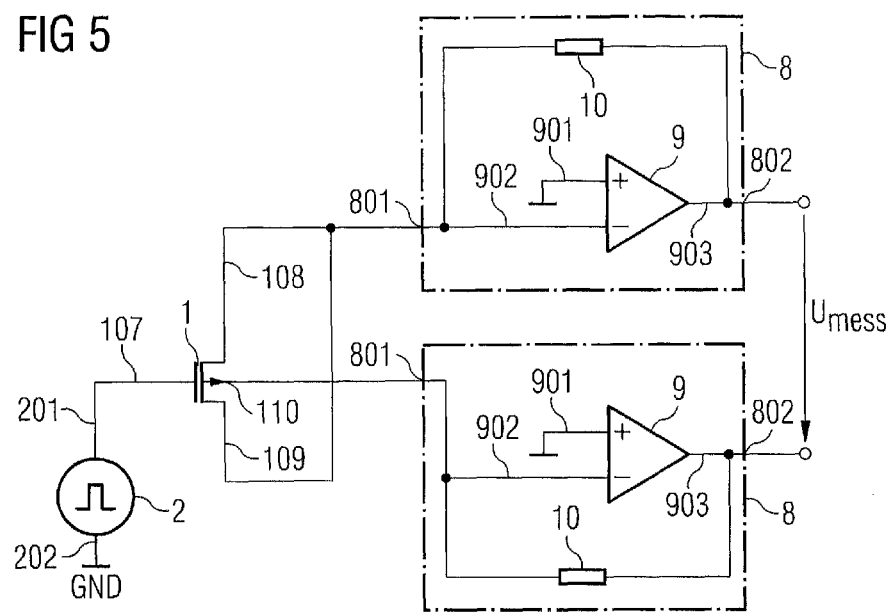
FIG. 5 shows a basic circuit diagram of the exemplary embodiment illustrated in FIG. 4.

FIG. 5 presents an alternative exemplary embodiment of a measuring arrangement. In contrast to FIG. 4, the current-voltage converters 8 are illustrated in greater detail. Each of the voltage converters 8 has an operational amplifier 9, wherein the positive input 901 of the operational amplifier is connected to a reference potential GND. The negative input 902 of the operational amplifier is connected to the drain and the source connection 108, 109 of the semiconductor component 1 or, in the case of the second current-voltage converter 8, to the substrate connection 110 of the semiconductor component 1. Furthermore, the operational amplifier 9 exhibits feedback via a feedback resistor 10. The output of the operational amplifier corresponds to the output of the current-voltage converter 8. Both current-voltage converters 8 are constructed identically in this case. The advantages known to the person skilled in the art are achieved by means of the operational amplifiers 9. The transconductance G is set by means of the feedback resistors 10.

Figure 6:
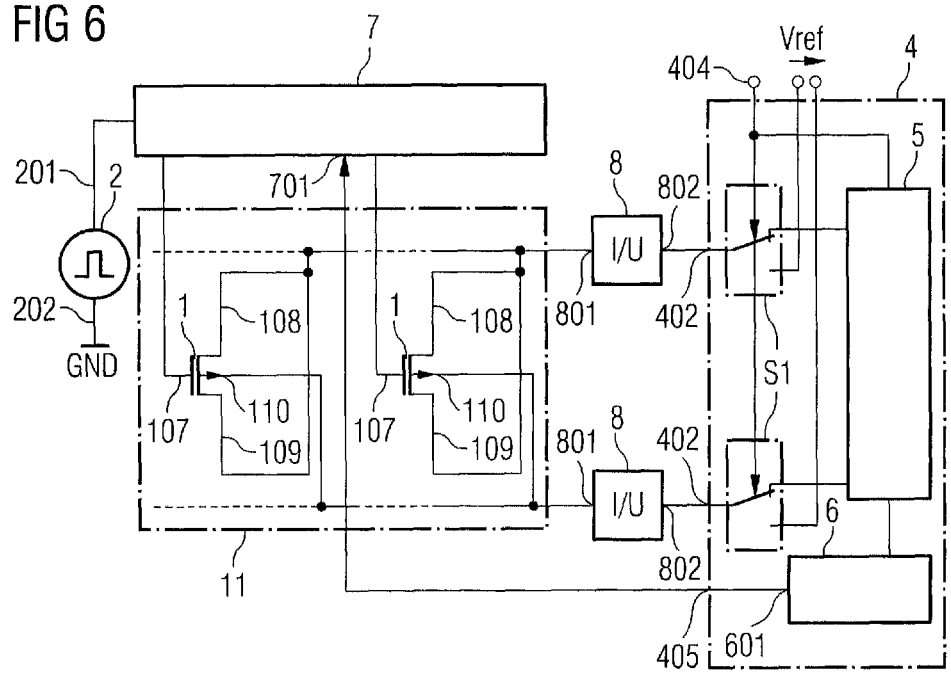
FIG. 6 shows an alternative exemplary embodiment of a measuring arrangement.

FIG. 6 presents an alternative exemplary embodiment of a measuring arrangement. In contrast to FIG. 4, two semiconductor components 1 are illustrated here. Furthermore, the evaluation unit 4 has a reference value output $V_{REF}$. By means of the switches S1 and S2, the outputs of the current-voltage converters 8 are connected either to the calculation unit 5 or to the reference value output Vref. A selection unit 7 is connected between the voltage source 2 and the respective gate connections 107 of the semiconductor components 1. The selection unit 7 has a control input 701 connected to a control output 601 of the data memory 6.

By means of the selection unit 7 and the voltage values 203, 204 described, each semiconductor component 1, alongside the operating states of inversion and accumulation, can also be switched on and off individually. In addition, the selection unit 7 can have means by which each semiconductor component 1 is switched in both for an inherent characterization and later as a reference source.

The evaluation unit 4 additionally has switch S1 and switch S2. These two switches can be changed over by means of a control input 404 of the evaluation unit 4. The changeover is effected in either software- or hardware-based fashion. The evaluation unit 4 is connected by a control output 405 to the control input 701 of the evaluation unit 7. The data memory 6 has a control output 601 connected to the control output 405 of the evaluation unit 4.

By means of the control input 404 of the evaluation unit 4, a changeover is made from an inherent characterization state to a reference source state of the overall arrangement. For this purpose, the switches S1 and S2 are switched from a first switching state to a second switching state, whereby a reference value can be tapped off at the reference value output Vref of the evaluation unit 4. An inherent characterization of the semiconductor components 1, as described in the descriptions concerning FIGS. 1 to 4, is effected beforehand. After the inherent characterization, that is to say the assignment of a concrete number N of defects 106 to each semiconductor component 1 by the evaluation unit 4, for each semiconductor component 1, the data necessary for operating the arrangement as a reference source are stored in the data memory 6. In this case it is possible to realize the evaluation unit 4 completely in hardware, although in part also in software.

Figure 7:
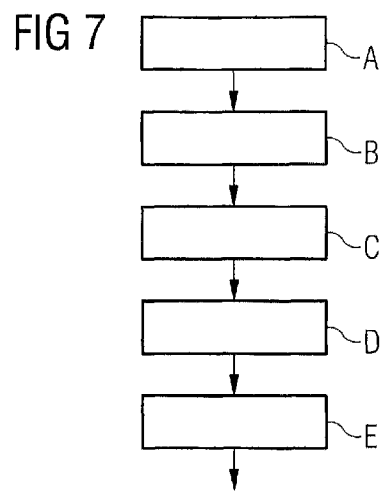
FIG. 7 shows a method flowchart for operating a semiconductor component as a reference source.

FIG. 7 presents a method flowchart for operating a reference source with previous inherent characterization of the semiconductor components 1 to be used. In this case, the first step A involves serially determining the measured values of the respectively successively selected semiconductor components 1. In a second step B, the analog measured values are converted into digital measured values. This is preferably effected by an analog-to-digital converter. In a third step C, a comparison unit in the evaluation unit 4 orders the digital measured values according to magnitude and marks the digital measured values with respect to the corresponding semiconductor component 1. In the comparison unit, for example the digital measured values of the respectively subsequently selected transistor are compared with the present digital measured value. Only integral differences occur between the two successive measured values. In a fourth step D, the measured value differences are ordered according to magnitude. In a fifth step E, the number of defects in each semiconductor component 1 is determined on the basis of the differences between the individual digital measured values and is stored as a datum in a data memory.

The method described describes firstly determining the measured values of the individual semiconductor components 1 successively. As an alternative, it is also possible for the relative relationship with the semiconductor components 1 that have already been characterized previously to be determined in parallel during the inherent characterization of the respective semiconductor components 1. The data determined accordingly are stored in the data memory by means of measured value differences, also referred to as jumps in the measured values.

In an exemplary embodiment that is not illustrated, firstly, the measured values of the semiconductor components 1 to be examined are determined. By means of coarse referencing, for example, by means of a bandgap circuit, the measured values are already coarsely assigned to a specific number N of defects 106. The precise number N of defects is then determined by means of a window comparator. This exemplary embodiment is advantageous when there are few defects 106, for example less than 10, in the semiconductor component 1 since, in such a case, a windowing of the individual defect stages can be effected with a tenable outlay.

After the allocation of concrete numbers N of defects 106 to the individual semiconductor components 1, it is possible to provide a very accurate reference source. By virtue of the numbers N of defects 106 determined, it is known which semiconductor component 1 supplies which multiple of the unit current I0 in operation. If a reference value is required, then it is possible, by means of the arrangement from FIG. 6, for a required reference value having a desired magnitude or a desired intensity to be taken from the evaluation unit 4 by means of the control input 404. In accordance with the desired requirements, those semiconductor components 1 are operated as a reference source by means of the stored data. By way of example, a current value or a voltage value is provided as the reference value.

Figure 8:
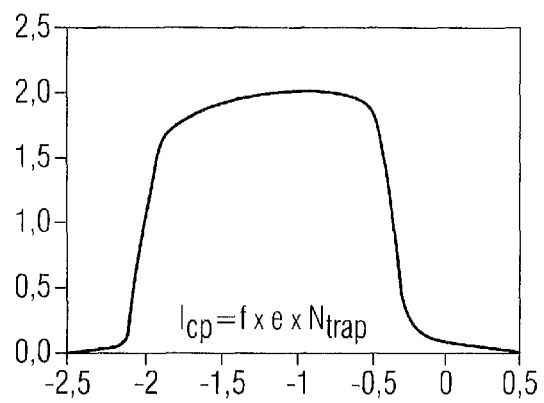
FIG. 8 shows a charge pump characteristic curve of a transistor with defects.

FIG. 8 indicates a charge pump (CP) curve of a semiconductor component 1 in MOSFET technology. For more detailed explanation, three possible cases will firstly be described. The amplitude of the trapezoidal voltage Vg that is applied to the gate connection layer 105 of the semiconductor component 1 shall always be 2.5 volts here.

In the first case, the lower voltage value Vg is minus one volt, for example. The upper voltage value of Vg accordingly corresponds to plus 1.5 volts. If the semiconductor component 1 is driven with this voltage, the channel is operated in accumulation for the lower voltage value and in inversion for the upper voltage value. In the first case, the current Imeas is guaranteed to occur.

In the second case, the lower voltage value Vg is minus 2.5 volts, for example. The upper voltage value accordingly corresponds to plus 0.5 volt. If the semiconductor component 1 is driven with this voltage, the channel is reliably operated in accumulation for the lower voltage value. The upper voltage value does not suffice, however, for operating the semiconductor component 1 in inversion. In the second case, the current Imeas does not occur.

In the third case, the lower voltage value Vg is 0 volts, for example. The upper voltage value accordingly corresponds to plus 2.5 volts. If the semiconductor component 1 is driven with this voltage, the channel is reliably operated in inversion for the upper voltage value. The lower voltage value does not suffice, however, for operating the semiconductor component 1 in accumulation. In the second case, the current Imeas likewise does not occur.

Figure 9:
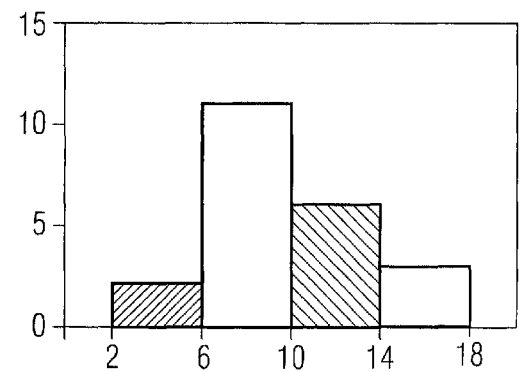
FIG. 9 shows a distribution of the number of transistors per number of defects in the case of a gate connection area of $(0.25 \times 0.3)\ \mu m^2$.

These three cases are also illustrated in FIG. 9. The lower voltage value of the trapezoidal voltage that is applied to the gate connection layer 105 is plotted on the abscissa. The measured current Imeas in picoamperes is plotted on the ordinate. Consequently, the characteristic curve in FIG. 8 shows at which lower voltage value the current Imeas occurs and the number N of defects 106 can be detected.

In FIG. 9, 20 semiconductor components 1 were inherently characterized and the number of semiconductor components 1 having a number N of defects 106 was indicated. In this case, each semiconductor component 1 has a gate area of $0.25 \times 0.3$ $\mu m^2$. It can be discerned that the number N of defects is less than 18 for this gate area. FIG. 9 furthermore reveals that a high number of semiconductor components 1 have a number N of defects of 6 to 9.

The number N of defects 106 for a semiconductor component 1 follows statistical laws, usually the Poisson distribution. This distribution states that a few numbers N of defects occur with very high probability, whereas at a distance from these most probable numbers it is more probable for a semiconductor component 1 to have more defects 106 than for it to have fewer defects 106. Thus, it is possible, for example, for a semiconductor component 1 to have no defect 106. This semiconductor component 1 cannot be used for forming a reference source according to the method described here.

It is likewise possible that specific numbers N of defects 106 will not occur in the semiconductor components 1 examined. If, therefore, only a small number of semiconductor components 1 are characterized, as in FIG. 9, then it is probable that for example no semiconductor component 1 will have only one defect 106. In this case, however, it is very probable that at least one semiconductor component 1 will have two or three defects. It is likewise possible for the smallest measured value difference determined to correspond to two defects 106 in the case of the semiconductor components 1 examined. The relationship between the measured value differences obtained and the number N of defects 106 of the semiconductor components 1 can easily be calculated by means of simple mathematical algorithms. This is possible in particular by determining the relationship between the measured values and ascertaining the multiples N with respect to the unit current I0.

In order to avoid the situation where numbers N of defects 106 are not present, a multiplicity of semiconductor components 1 are characterized, their number N of defects is determined and this is stored as a datum in a data memory. An order of magnitude of one hundred or more inherent characterizations is thus advantageous in order to obtain a good statistical basis with regard to the numbers N of defects 106.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A measuring arrangement comprising:
   at least one semiconductor component having a semiconductor substrate, at least one doped region in the semiconductor substrate adjoining a top side of the semiconductor substrate in planar fashion, an insulation layer on the top side of the semiconductor substrate adjoining the doped region, a gate connection layer on the insulation layer and a dangling bond defect in the interface between the insulation layer and the semiconductor substrate caused by a lattice constant mismatch between the semiconductor substrate and the insulation layer;
   a voltage source connected to the gate connection layer by a first connection and to a reference potential by a second connection and operable to apply a first voltage to the gate connection layer which causes a free mobile charge carrier to be bound in the defect and apply a second voltage to the gate connection layer which causes the defect to liberate the free mobile charge carrier; and
   a measuring unit having at least a first and a second input and an output, the first input being connected to the semiconductor substrate, the second input being connected to the doped region and the output operable to provide a measured value that is proportional to the number of dangling bond defects in the interface between the insulation layer and the semiconductor substrate.

2. The measuring arrangement as claimed in claim 1, wherein the voltage source is operable to generate a trapezoidal voltage having at least a first and a second voltage value, the first voltage value operates the semiconductor component in accumulation and the second voltage value operates the semiconductor component in inversion, and wherein the free mobile charge carrier is bound in the defect when the semiconductor component is operated in inversion and liberated from the defect when the semiconductor component is operated in accumulation.

3. The measuring arrangement as claimed in claim 2, wherein the measured value provided is equal to the product of the frequency of the voltage, the elementary charge and the number of dangling bond defects in the interface between the insulation layer and the semiconductor substrate.

4. The measuring arrangement as claimed in claim 1, wherein the semiconductor component has a minimum gate length and/or a minimum gate width corresponding to a fabrication technology.

5. The measuring arrangement as claimed in claim 1, wherein:
   the measuring arrangement comprises an evaluation unit having a first input connected to the output of the measuring unit and an output; and
   the evaluation unit being operable to calculate the number of dangling bond defects in the interface between the insulation layer and the semiconductor substrate and provide a reference value at its output that is proportional to the number of defects.

6. The measuring arrangement as claimed in claim 5, wherein a calculation unit of the evaluation unit is operable to calculate the number of dangling bond defects in the interface between the insulation layer and the semiconductor substrate and store the number of defects as a datum in a data memory.

7. The measuring arrangement as claimed in claim 6, wherein:
   the measuring arrangement has a first and a second operating state;
   in the first operating state, the evaluation unit is operable to determine the number of dangling bond defects in the interface between the insulation layer and the semiconductor substrate and store the number of defects as a datum in the data memory;
   in the second operating state, the semiconductor component is operated as a reference source and the reference value is provided at the output of the evaluation unit; and
   a control signal at a control input of the evaluation unit operable to change the operating state of the measuring arrangement.

8. A measuring arrangement comprising a plurality of semiconductor components, wherein:
   at least one semiconductor component is configured as claimed in claim 7;
   a selection unit is arranged between the voltage source and the respective gate connection layer;
   the evaluation unit has a control output connected to a control input of the selection unit;

the selection unit, in the first operating state, is operable to electrically conductively connect in each case only one gate connection layer to the voltage source;

the evaluation unit, in the first operating state, is operable to calculate the number of dangling bond defects in the interface between the insulation layer and the semiconductor substrate and store the number of defects as a datum in the data memory; and the evaluation unit, in the second operating state, is operable to control the selection unit via the control output.

9. The measuring arrangement as claimed in claim 5, wherein the reference value is a current value, a voltage value, and/or a charge value.

10. The measuring arrangement as claimed in claim 1, wherein the measured value is a current value.

11. A semiconductor arrangement comprising:

a semiconductor component having a semiconductor substrate, at least one doped region in the semiconductor substrate adjoining a top side of the semiconductor substrate in planar fashion, an insulation layer on the top side of the semiconductor substrate adjoining the doped region, a gate connection layer on the insulation layer and a dangling bond defect in the interface between the insulation layer and the semiconductor substrate caused by a lattice constant mismatch between the semiconductor substrate and the insulation layer;

a measuring unit having at least a first and a second input and an output, the first input being connected to the semiconductor substrate, the second input being connected to the doped region and the output operable to provide a measured value that is proportional to the number of dangling bond defects in the interface between the insulation layer and the semiconductor substrate; and at least a first and a second converting unit operable to convert a current into a voltage, the first converting unit being connected by an input to the at least one doped region of the semiconductor component, the second converting unit being connected by an input to the semiconductor substrate of the semiconductor component and the converting units each having an output, wherein a voltage that is proportional to the number of dangling bond defects is provided between the two outputs.

12. The semiconductor arrangement as claimed in claim 11, wherein the converting units comprise feedback operational amplifier circuits.

13. A method for operating a semiconductor component having at least one semiconductor component including a semiconductor substrate, at least one doped region in the semiconductor substrate adjoining a top side of the semiconductor substrate in planar fashion, an insulation layer on the top side of the semiconductor substrate adjoining the doped region, a gate connection layer on the insulation layer and a dangling bond defect in the interface between the insulation layer and the semiconductor substrate caused by a lattice constant mismatch between the semiconductor substrate and the insulation layer, the method comprising the steps of:

applying a trapezoidal voltage to the gate connection layer, the trapezoidal voltage having a first voltage value operating the semiconductor component in accumulation and a second voltage value operating the semiconductor component in inversion, wherein a free mobile charge carrier is bound in the defect when the semiconductor component is operated in inversion and liberated from the defect when the semiconductor component is operated in accumulation;

connecting a first measuring input of a measuring unit to the at least one doped region of the semiconductor component and a second measuring input of the measuring unit to the substrate of the semiconductor component;

detecting a measured value at an output of the measuring unit, wherein the measured value is proportional to the number of dangling bond defects in the interface between the insulation layer and the semiconductor substrate; and operating the semiconductor component as a reference source, wherein the measured value is converted into a reference value.

14. The method as claimed in claim 13, wherein the semiconductor component is a transistor.

15. The method as claimed in claim 13, wherein the measured value of a plurality of semiconductor components is determined successively, wherein the individual semiconductor components are selected by means of a selection unit and at least one semiconductor component has a dangling bond defect.

16. The method as claimed in claim 15, wherein an evaluation unit determines the number of dangling bond defects from the measured value of the respectively selected component and stores it as a datum in a data memory.

17. The method as claimed in claim 16, wherein:

the measured values of the respectively selected semiconductor component are determined successively;

the evaluation unit converts the analog measured values into digital measured values;

a comparison unit in the evaluation unit orders the digital measured values according to the magnitude of the measured value and marks the digital measured values with regard to the corresponding semiconductor component;

the differences between the individual digital measured values are ordered according to magnitude; and on the basis of the differences between the individual digital measured values, the number of dangling bond defects of each semiconductor component is determined and is stored as a datum in the data memory.

18. The method as claimed in claim 17, wherein at least one of the semiconductor components is operated as a reference source after the number of dangling bond defects has been determined, and the correspondingly stored datum is used for operation as a reference source.

19. The method as claimed in claim 18, wherein the reference value is characteristic of a current value, a voltage value or a charge.

* * * * *